(12) United States Patent
Barsukov et al.

(10) Patent No.: US 7,808,244 B2
(45) Date of Patent: Oct. 5, 2010

(54) SYSTEM AND METHOD FOR DETERMINING STATE OF CHARGE OF A BATTERY UTILIZING INITIAL VOLTAGE AND CURRENT MEASUREMENT AND A PREVIOUS ESTIMATE OF BATTERY RESISTANCE

(75) Inventors: Yevgen Pavlovich Barsukov, Richardson, TX (US); William Harold Jackson, Jr., Plano, TX (US); Jinrong Qian, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 107 days.

(21) Appl. No.: 12/059,337

(22) Filed: Mar. 31, 2008

(65) Prior Publication Data

US 2009/0248331 A1 Oct. 1, 2009

(51) Int. Cl.
G01N 27/416 (2006.01)

(52) U.S. Cl. .................. 324/430; 324/426; 324/433; 320/132; 320/149; 320/DIG. 21

(58) Field of Classification Search .......... 324/430, 324/426, 433; 320/132, 149, DIG. 21
See application file for complete search history.

(56) References Cited

U.S. PATENT DOCUMENTS

| 4,423,379 | A | * | 12/1983 | Jacobs et al. .................. 324/429 |
|---|---|---|---|---|
| 4,876,513 | A | * | 10/1989 | Brilmyer et al. ............ 324/427 |
| 4,937,528 | A | * | 6/1990 | Palanisamy .................. 324/430 |
| 5,789,924 | A | * | 8/1998 | Okada ........................ 324/428 |
| 6,563,318 | B2 | * | 5/2003 | Kawakami et al. .......... 324/426 |
| 6,696,818 | B2 | * | 2/2004 | Arai et al. .................... 320/132 |
| 6,789,026 | B2 | | 9/2004 | Barsukov et al. |
| 6,832,171 | B2 | * | 12/2004 | Barsoukov et al. ............ 702/65 |
| 6,892,148 | B2 | | 5/2005 | Barsukov et al. |
| 7,405,571 | B1 | * | 7/2008 | Liu ............................ 324/430 |
| 2007/0194791 | A1 | * | 8/2007 | Huang ........................ 324/430 |
| 2007/0200567 | A1 | * | 8/2007 | Mizuno et al. .............. 324/430 |

* cited by examiner

Primary Examiner—Edward Tso
Assistant Examiner—Manuel Hernandez
(74) Attorney, Agent, or Firm—William B. Kempler; Wade J. Brady, III; Frederick J. Telecky, Jr.

(57) ABSTRACT

A processor executes a program to calculate values of the internal resistance R of a battery and updates a database of parameters defining the dependence of internal resistance on the battery state of charge (SOC) and temperature. The database is utilized to obtain the information needed to make accurate remaining run-time calculations. The processor may also execute a program to effectuate entry of a database into memory representative of characteristics of the battery including values of measured open circuit voltages (OCV) of the battery and determinations of "starting SOC" values that correspond to the most recently measured values of OCV after the battery has stabilized. The processor may also execute programs to determine the present SOC of the battery, the present battery capacity, and the remaining run-time of the device powered by the battery.

13 Claims, 3 Drawing Sheets

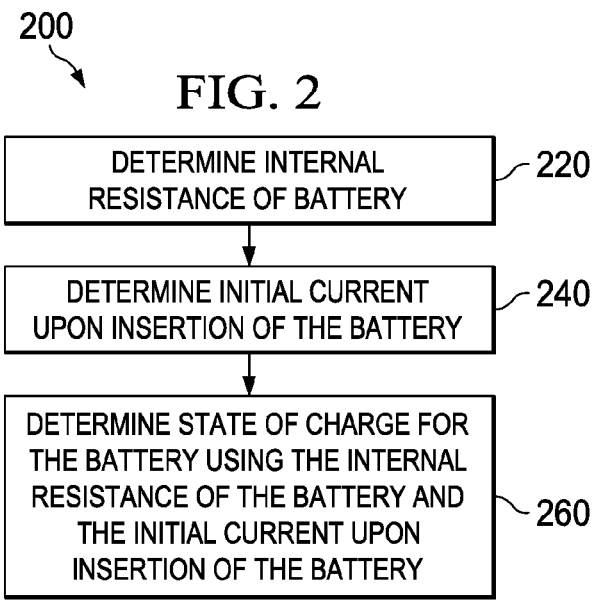
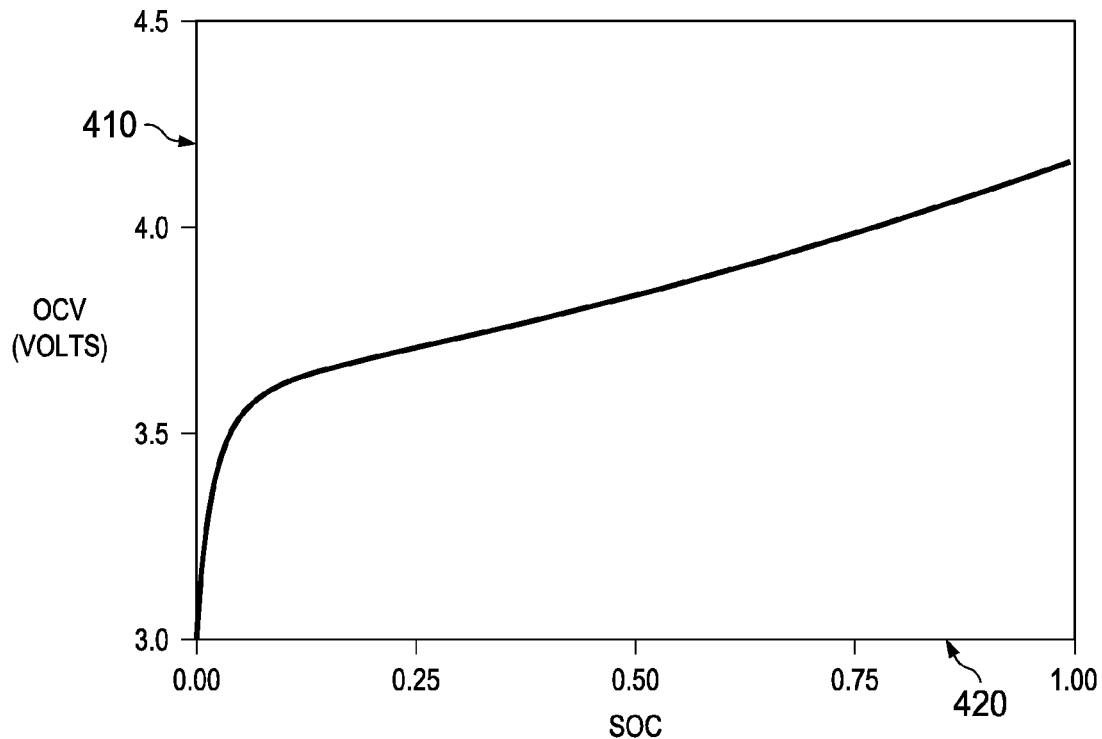

SYSTEM AND METHOD FOR DETERMINING STATE OF CHARGE OF A BATTERY UTILIZING INITIAL VOLTAGE AND CURRENT MEASUREMENT AND A PREVIOUS ESTIMATE OF BATTERY RESISTANCE

TECHNICAL FIELD

The present disclosure is generally related to electronics and, more particularly, is related to systems and methods for determining a state of charge for a battery.

BACKGROUND

Typically, a gas gauge is a capacity monitoring and reporting device, which monitors a voltage drop across a small current sense resistor connected in series with the battery to determine charge and discharge activity of the battery. Compensations for battery temperature, self-discharge, and discharge rate may be applied to the capacity measurements to provide available time-to-empty information across a wide range of operating conditions. The gas gauge device may be located inside the battery pack or inside the host device in which the battery is inserted.

SUMMARY

Example embodiments of the present disclosure provide a system and method for determination of a state of charge of a battery by a host.

Briefly described, in architecture, one example embodiment of the system, among others, can be implemented as a processor configured to determine an internal resistance of a battery; determine an initial current upon insertion of the battery, I0; determine a state of charge for the battery using the internal resistance of the battery and the initial current; and report the state of charge.

Embodiments of the present disclosure can also be viewed as providing methods for determination of a state of charge of a battery by a host. In this regard, one embodiment of such a method, among others, can be broadly summarized by the following steps: determining an internal resistance of a battery; determining an initial current upon insertion of the battery, I0; determining a state of charge for the battery using the internal resistance of the battery and the initial current; and reporting the state of charge.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 2 is a flowchart of an example embodiment of a method for determination of a state of charge of a battery by a host using the gas gauge device of FIG. 1.

FIG. 4 is a example embodiment of a graph for correlating state of charge and battery voltage for a battery to be used in the method of FIG. 3.

DETAILED DESCRIPTION

Figure 1:
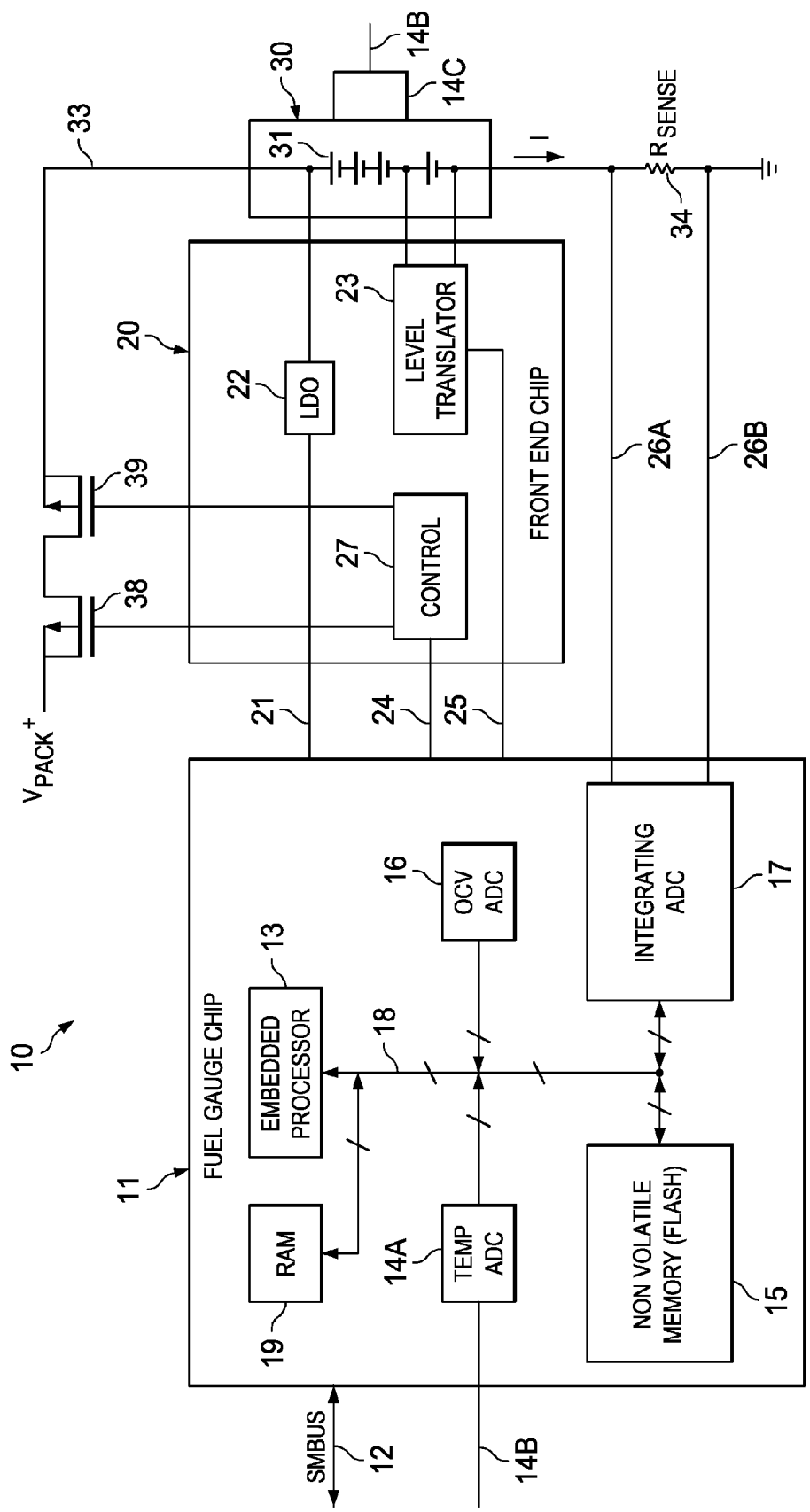
FIG. 1 is a system view of an example embodiment of a gas gauge device for determining of a state of charge of a battery by a host.

Embodiments of the present invention will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

The logic of the example embodiment(s) of the present invention can be implemented in hardware, software, firmware, or a combination thereof. In example embodiments, the logic is implemented in software or firmware that is stored in a memory, such as non-volatile memory 15 of FIG. 1, and that is executed by a suitable instruction execution system, such as embedded processor 13 of FIG. 1. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present invention includes embodying the functionality of the example embodiments of the present invention in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, system, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Any process descriptions or blocks in flow charts should be understood as representing modules, segments, or portions of code which include one or more executable instructions for implementing specific logical functions or steps in the process, and alternate implementations are included within the scope of the example embodiment of the present invention in which functions may be executed out of order from that shown or discussed, including substantially concurrently or in reverse order, depending on the functionality involved, as would be understood by those reasonably skilled in the art of the present invention. In addition, the process descriptions or blocks in flow charts should be understood as representing decisions made by a hardware structure such as a state machine known to those skilled in the art.

Referring to FIG. 1, battery fuel gauge system 10 includes battery fuel gauge integrated circuit chip 11 that includes embedded processor 13 coupled by bidirectional digital bus 18 to temperature sensor circuit 14A, nonvolatile memory 15, random access memory (RAM) 19, analog-to-digital converter (ADC) 16, and integrating analog-to-digital converter 17. Temperature sensor circuit 14A is coupled via line 14B to external sensor 14, which is directly attached to battery 30 shown in FIG. 1. Nonvolatile memory 15 could be a conventional flash memory, ADC 16 and ADC 17 both can be conventional analog-to-digital converters, and embedded processor 13 can, for example, be a commercially available 8 MHz processor having an 8-bit central processing unit (CPU) and a RISC architecture. Various suitable embedded processors that are commercially available can be utilized. For example, the MSP430 microprocessor is capable of performing the necessary computations, or an embedded processor such as the one used in the BQ8012 fuel gauge chip can be used.

Fuel gauge chip 11 is coupled to standard SMBus (smart bus) 12 by means of which the fuel gauge chip 11 communicates with another processor (not shown) in accordance with a suitable communications protocol. A conventional interface circuit (not shown) is coupled between SMBus 12 and digital bus 18. Fuel gauge chip 11 is powered by a supply voltage on conductor 21, which is connected to the output of low dropout (LDO) voltage regulator circuit 22 which is included in "front end" integrated circuit chip 20. Bidirectional digital bus 24 is coupled between conventional digital interface circuitry (not shown) in accordance with a standard I2IC in integrated circuit 11 and control circuitry 27 in fuel gauge chip 20. Front-end chip 20 also includes level translator circuit 23 that is coupled by suitable circuitry (not shown) to measure the voltage across one (or more) of individual lithium-ion cells 31 included in battery 30 which is used to provide power to a utilization device (not shown) coupled between the "battery pack" terminals V+ and ground. Level translator circuit 23 produces an output that is connected by conductor 25 to the analog input of ADC 16 in integrated circuit 11. ADC 16 converts the cell voltage to a digital equivalent that can be accessed via digital bus 18 by embedded processor 13.

The total voltage across battery 30 (which can be considered to be equal to the voltage across one of the cells multiplied by the number of cells connected in series) is applied to an input of voltage regulator 22. A 1-100 milli-ohm sense resistor 34 is coupled between ground and the (−) terminal of battery 30, and the voltage across sense resistor 34 is applied as an input to integrating ADC 17, which converts the voltage across sense resistor 34 to a digital representation of the battery current flowing through sense resistor 34. The (+) terminal of battery 30 is connected by conductor 33 to the source of power transistor 39, the gate of which is connected to control circuit 27 and front end chip 20. The drain of power transistor 39 is connected to the drain of power transistor 38, the source of transistor 39 is connected to the battery pack voltage V+, and the gate of transistor 39 is connected to control circuitry 27. The gate of transistors 38 and 39 are controlled in response to signals received by front-end chip 20 from embedded processor 13 via bus 24. Transistor 39 is a discharging transistor and transistor 38 is a charging transistor. Front-end chip 20 includes conventional interface and control circuitry 27 coupled to bidirectional digital bus 24 in accordance with the standard I2IC protocol in order to control power transistors 38 and 39.

Various information can be sent from fuel gauge chip 11 via digital bus 24 to front-end chip 20 in order to set various levels and to transmit various safety/control information to front-end chip 20, for example to turn the power transistors 38 and 39 on and off under appropriate conditions.

Embedded processor 13 executes a program represented by the flowchart of FIG. 2 to calculate values of the internal resistance R of battery 30 in accordance with the present disclosure and update a database of parameters defining the dependence of internal resistance on the battery state of charge and temperature. The database is utilized as subsequently explained to obtain the information needed to make accurate remaining run-time calculations. Embedded processor 13 also executes a program represented by the subsequently described flowchart of FIGS. 2 and 3 to effectuate entry of a database into flash memory 15, for example, representative of characteristics of battery 30, values of measured open circuit voltages (OCV) of battery 30, and determinations of "starting SOC" values that correspond to the most recently measured values of OCV after the battery has stabilized. Embedded processor 13 also executes programs to determine the present SOC of the battery, the present battery capacity, and the remaining run-time of the device powered by the battery.

Information about remaining capacity may be important for operation of portable devices, for example to prevent data loss. If battery pack 30 is removed from a device, the information about the pack's state of charge could be lost. A common solution may be to store the state of charge information inside the battery pack electronics. However, this increases the price of battery pack 30 significantly. Alternatively, the state of charge information can be stored in the host device along with the gas gauge electronics 10. The measurement of the state of charge can then be initialized when battery pack 30 is reinserted into the host device. The state of charge can be simply determined based on a voltage reading across the battery. However, current flow during insertion can cause an IR drop inside battery pack 30, which can prevent an accurate reading of the pack voltage, causing a large error.

If battery 30 with an integrated gas gauge 10 is taken out of the system, the state of charge information stays with battery 30. Thus, there is no loss of state of charge information if that same battery is reinserted. However, if the gas gauge 10, instead, is in the host in which battery 30 is inserted, multiple batteries could be reinserted, thereby losing the state of charge information for a particular battery. For example, in a situation in which two battery packs are used interchangeably, a first pack is inserted and the charge and discharge profiles are learned. When a second battery pack is inserted, the parameters from the first pack are unlearned and the parameters for the second pack are learned.

Parameter variations could be due to cell-to-cell variations, for example. Even if the cells in battery 30 have the same age, some difference may occur between the cell parameters. In one non-limiting example in which the first battery pack is new and the second battery pack is older, the internal resistance of the second battery pack may have increased, the cycle time may have decreased, and/or the capacity may have decreased. The usable charge time of the second battery pack, therefore, has decreased. To keep track of the batteries, the battery pack that is inserted is automatically detected. The resistance and total capacity values of one or more packs may be tracked by storing the values in one or more tables in memory, for example, non-volatile flash memory.

When pack 1 or pack 2 is detected, for example, values for the corresponding pack may be retrieved from memory. The pack may be detected to select which of the values in memory may be used. Example embodiments of detection methods include measuring resistance of the battery and comparing with a resistance value stored for the same state of charge in the memory for pack 1 and pack 2. In an example embodiment, the pack which has the closest resistance value is selected. If the measured value is closest to a default "new pack" value, "new pack" detection takes place. When a pack is determined to be a "new-pack," a new table may be generated, or the memory values for a pack that was not used last time may be overwritten by defaults. Optimized new values may then be learned and saved to the memory.

In an alternative embodiment for battery pack detection, a serial number may be read from an ID-chip that may be located in the battery pack. The values for the corresponding pack may be retrieved from memory. Another alternative method comprises reading a value of an ID-resistor that may be included in the battery pack. Again, the values for the corresponding pack may be retrieved from memory.

When a particular battery pack is detected, the state of charge of that particular battery pack is determined using method 200 provided in FIG. 2. In block 220, the internal resistance of the battery is determined. In block 240, the initial current is determined upon insertion of the battery. In block 260, the state of charge of the battery is determined using the internal resistance of the battery and the initial current upon insertion of the battery.

Figure 3:
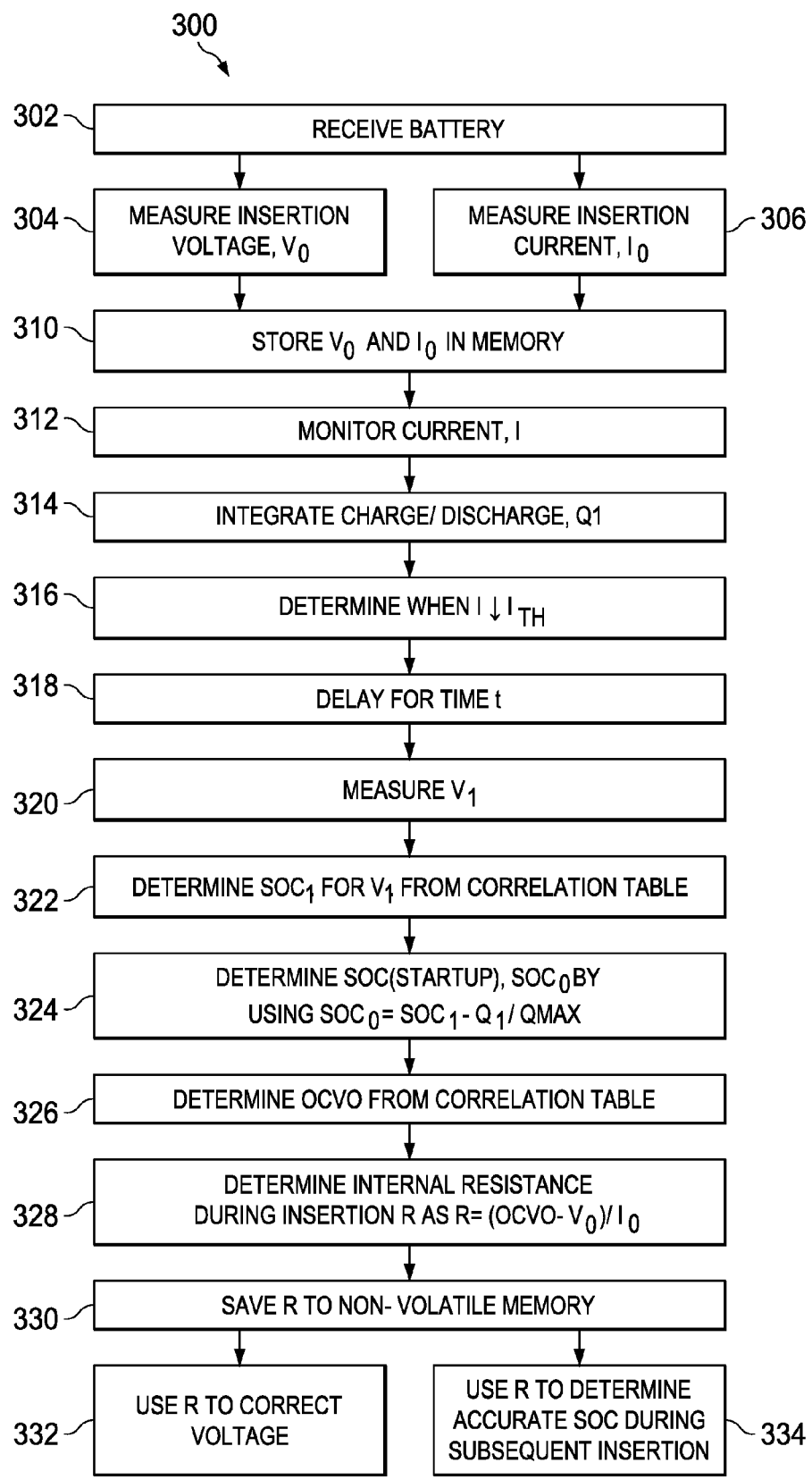
FIG. 3 is a detailed flowchart of an example embodiment of a method for determination of a state of charge of a battery by a host using the gas gauge device of FIG. 1.

A more detailed method of determining the battery state of charge 300 is provided in FIG. 3. I block 302, the battery is received into a host system. In block 304, the initial voltage, Vo, across the battery pack is measured. Also, in block 306, initial current, Io, through resistor 34 of FIG. 1 is measured. In block 310, Vo and Io are stored in memory. In block 312, the current, I, through resistor 34 is monitored. In block 314, the current I is used to calculate the charge/discharge rate, Q1, which is integrated over a selected time period. The selected time period may extend to the end of a discharge period, for example, when current goes below a predefined threshold. Such a threshold may be set to a value that is lower than a typical application load current, but higher than a typical sleep (low-power mode) current.

In block 316, Q1 is monitored to determine when it falls below a threshold $I_{th}$ to determine that it is not in use. Threshold $I_{th}$ is determined such that the value is lower than a typical application load current, but higher than a typical sleep (low-power mode) current. In block 318, the process is delayed for a time t. Time t may be selected to assure that the battery voltage has stopped changing, e.g. battery has reached "relaxed state." Time t may be set to 30 min in a non-limiting example. In addition to time criteria, in example embodiments, voltage change is monitored. For example, if dV/dt<4 uV/sec, sufficient relaxation may be detected.

After time t, in block 320, Vi is measured across the battery pack. In block 322, a correlation table, representing curve 400 of the open circuit battery voltage vs. the state of charge as provided in FIG. 4, is consulted to determine state of charge (SOC1) for $V_i$ measured in block 320. In block 324, the startup state of charge, SOC0, by:

SOC0=SOC1−Q1/$Q_{max}$, where $Q_{max}$ is a maximum charge capacity for the battery pack.

In block 326, using SOC0, the undistorted initial voltage OCV0 is found from the correlation table. In block 328, the effective internal resistance during insertion is found as R=(OCV0−V$o$)/Io.

In block 330, R is saved to non-volatile memory. In block 332, R is used to correct voltage, and, in block 334, R is used to determine accurate state of charge information during subsequent insertions.

FIG. 4 provides a non-limiting example of graph 400 of the open circuit battery voltage 410 vs. the state of charge 420 for a particular battery type. Graph 400 is chemistry dependent. Examples of battery chemistries include, but are not limited to, nickel-metal hydride, lithium-ion, and nickel-cadmium, among others. The SOC(OCV) dependence or characteristic is generally applicable to all batteries having a particular chemistry. For example, a comparison of the OCV vs. SOC for four different batteries from four different manufacturers shows that the OCVs do not differ by more than approximately 5 millivolts. So, the same graph can be used for all batteries of the same chemistry. Each OCV measurement is made for a known SOC, the first OCV measurement being made when the battery is fully charged and relaxed. Similarly, the next OCV measurement is made after a known amount of charge has been discharged from the battery and it has been relaxed. So, the second SOC is known, and so forth for each additional OCV measurement, until one of the successively measured OCV values is reduced to a manufacturer's $V_{min}$.

It should be emphasized that the above-described embodiments of the present disclosure are merely possible examples of implementations, set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

The invention claimed is:

1. A method of determining a true internal resistance R of a battery when the battery is inserted into a user device which draws current from the battery comprising:

providing a connection to receive voltage from a battery which will draw current from the battery;

determining an initial voltage, V0, upon insertion of the battery;

determining an initial estimate of internal resistance of a battery;

determining an initial current, I0, upon insertion of the battery;

determining a state of charge for the battery using the initial estimate internal resistance of the battery and the initial current;

determining a state of charge, SOC1, associated with a measured relaxed state voltage of the battery;

determining a startup state of charge, SOC0, from SOC1, a charge/discharge rate Q1, and a maximum battery charge, Qmax;

determining an undistorted initial voltage OCV0 for the SOC0; and determining a true value of the internal resistance R from the undistorted initial voltage OCV0, initial voltage V0 and the initial current I0.

2. The method of claim 1 further comprising:
integrating the charge/discharge rate over a time t.

3. The method of claim 2, further comprising:
determining when a load current drops below a predetermined threshold current, Ith;
delaying for a time, t2, or until a rate of voltage change falls below a predetermined threshold rate; and
measuring a relaxed state voltage of the battery.

4. The method of claim 1, further comprising:
saving R to non-volatile memory and associating R with the inserted battery.

5. The method of claim 1, further comprising:
determining a corrected initial voltage upon insertion V01 from R.

6. The method of claim 1, further comprising:
determining a corrected state of charge SOCc from R.

7. A system comprising:
a processor being couplable to a battery which will draw current from the battery and configured to:
determine an initial estimate of internal resistance R of a battery;
determine an initial current upon insertion of the battery, I0;
determine a state of charge for the battery using the initial estimate of internal resistance of the battery and the initial current;
determining an initial voltage, V0, upon insertion of the battery;
determine a state of charge, SOC1, associated with the measured relaxed state voltage of the battery;
determine a startup state of charge, SOC0, from SOC1, a charge/discharge rate Q1, and a maximum battery charge, Qmax;
determine an undistorted initial voltage OCV0 for the SOC0; and
determine a true value of the initial resistance R from the undistorted initial voltage OCV0, the initial voltage V0 and the initial current I0.

8. The system of claim 7, further comprising memory for saving R and associating R with the inserted battery.

9. The system of claim 8, wherein the processor is further configured to:
integrate the charge/discharge rate over a time t.

10. The system of claim 7, wherein the processor is further configured to:
determine when a load current drops below a predetermined threshold current, Ith;
delay for a time, t2, or until a rate of voltage change falls below a predetermined threshold rate; and
measure a relaxed state voltage of the battery.

11. The system of claim 7, wherein the processor is further configured to determine a corrected initial voltage upon insertion V01 from R.

12. The system of claim 7, wherein the processor is further configured to determine a corrected state of charge SOCc from R.

13. A system comprising:
means couplable to a battery which will draw current from the battery for determining an initial estimate of internal resistance of a battery;
means for determining an initial current upon insertion of the battery, I0;
means for determining a state of charge for the battery using the internal resistance of the battery and the initial current;
means for determining an initial voltage, V0, upon insertion of the battery;
means for monitoring a steady state current to determine a charge/discharge rate, Q1;
means for integrating the charge/discharge rate over a time t;
means for determining when a load current drops below a predetermined threshold current, Ith;
means for delaying for a time, t2, or until a rate of voltage change falls below a predetermined threshold rate;
means for measuring a relaxed state voltage of the battery;
means for determining a state of charge, SOC1, associated with the measured relaxed state voltage of the battery;
means for determining a startup state of charge, SOC0, from SOC1, Q1, and a maximum battery charge, Qmax;
means for determining an undistorted initial voltage OCV0 for the SOC0;
means for determining the internal resistance during insertion, R, from OCV0, V0 and I0; and
means for determining a corrected initial voltage V01 or a corrected state of charge SOCc upon insertion from R.

* * * * *